(12) United States Patent
Schmidt et al.

(10) Patent No.: US 8,545,722 B2
(45) Date of Patent: Oct. 1, 2013

(54) ILLUMINATION SYSTEM COMPRISING A RADIATION SOURCE AND A LUMINESCENT MATERIAL

(75) Inventors: Peter Schmidt, Aachen (DE); Jorg Meyer, Aachen (DE); Walter Mayr, Alsdorf (DE); Hans-Helmut Bechtel, Roetgen (DE)

(73) Assignee: Koninklijke Philips N.V., Eindhoven (NL)

( * ) Notice: Subject to any disclaimer, the term of this patent is extended or adjusted under 35 U.S.C. 154(b) by 1399 days.

(21) Appl. No.: 11/816,702

(22) PCT Filed: Feb. 10, 2006

(86) PCT No.: PCT/IB2006/050442
§ 371 (c)(1),
(2), (4) Date: Aug. 20, 2007

(87) PCT Pub. No.: WO2006/087661
PCT Pub. Date: Aug. 24, 2006

(65) Prior Publication Data
US 2010/0133563 A1    Jun. 3, 2010

(30) Foreign Application Priority Data
Feb. 21, 2005   (EP) .................... 05101311

(51) Int. Cl.
*H05B 33/14* (2006.01)
*C09K 11/08* (2006.01)
*C09K 11/77* (2006.01)

(52) U.S. Cl.
USPC ............. 252/301.4 F; 313/503; 313/486; 257/98

(58) Field of Classification Search
USPC ............. 252/301.4 F; 313/503, 486; 257/98
See application file for complete search history.

(56) References Cited

U.S. PATENT DOCUMENTS

| | | | |
|---|---|---|---|
| 5,998,925 A | 12/1999 | Shimizu | |
| 7,514,721 B2* | 4/2009 | Krames et al. | 257/98 |
| 2003/0030038 A1 | 2/2003 | Mitomo et al. | |
| 2003/0052595 A1 | 3/2003 | Ellens et al. | |

FOREIGN PATENT DOCUMENTS

| | | |
|---|---|---|
| DE | 10105800 | 8/2002 |
| DE | 10147040 | 4/2003 |
| EP | 1385215 | 1/2004 |
| EP | 1413618 | 4/2004 |
| EP | 1413619 | 4/2004 |
| WO | WO2004036962 | 4/2004 |

* cited by examiner

Primary Examiner — Carol M Koslow

(57) ABSTRACT

An illumination system, comprising a radiation source and a luminescent material comprising at least one phosphor capable of absorbing a part of light emitted by the radiation source and emitting light of wavelength different from that of the absorbed light; wherein said at least one phosphor is a yellow red-emitting cerium(III)-activated alkaline earth oxonitridoaluminosilicate of general formula $Ca_{1-x-y}A_xAl_{1+a-b}B_bSi_{1-a}N_{3-a}O_a$:Cey, wherein A selected from the group comprising beryllium, magnesium, strontium, barium, zinc, manganese, lithium, sodium, potassium, rubidium, praseodymium, samarium, europium, and B selected from the group comprising boron, gallium, scandium and wherein $0 < x \leq 1$; $0 < y < 0.2$; $0.001 < a < 1$ and $0.001 < b < 1$ can provide light sources having high luminosity and color-rendering index, especially in conjunction with a light emitting diode as a radiation source. The red to yellow-emitting cerium (III)-activated alkaline earth oxonitridoaluminosilicate of general formula $Ca_{1-x-y}A_xAl_{1+a-b}B_bSi_{1-a}N_{3-a}O_a$:Cey, wherein A selected from the group comprising beryllium, magnesium, strontium, barium, zinc, manganese, lithium, sodium, potassium, rubidium, praseodymium, samarium, europium, and B selected from the group comprising boron, gallium, scandium and wherein $0 < x \leq 1$; $0 < y < 0.2$; $0.001 < a < 1$ and $0.001 < b < 1$ is efficiently excitable by primary radiation in the near UV-to-blue range of the electromagnetic spectrum.

13 Claims, 5 Drawing Sheets

ILLUMINATION SYSTEM COMPRISING A RADIATION SOURCE AND A LUMINESCENT MATERIAL

BACKGROUND OF THE INVENTION

The present invention generally relates to an illumination system comprising a radiation source and a luminescent material comprising a phosphor. The invention also relates to a phosphor for use in such an illumination system.

More particularly, the invention relates to an illumination system and luminescent material comprising a phosphor for the generation of specific, colored light, including white light, by luminescent down conversion and additive color mixing based on an ultraviolet or blue radiation emitting radiation source. A light-emitting diode as a radiation source is especially contemplated.

Recently, various attempts have been made to make white light emitting illumination systems by using visibly colored light emitting diodes as radiation sources. When generating white light with an arrangement of visibly colored red, green and blue light emitting diodes, there has been such a problem that white light of the desired tone cannot be generated due to variations in the tone, luminance and other factors of visibly colored light emitting diodes.

In order to solve these problems, there have been previously developed various white light illumination systems, which convert the radiation of UV to blue light emitting diodes by means of a luminescent material comprising a phosphor to provide a visible white light illumination.

Phosphor converted white light illumination systems have been based in particular either on the trichromatic (RGB) approach, i.e. on mixing three colors, namely red, green and blue, in which case the latter component of the output light may be provided by a phosphor or by the primary emission of the light emitting diode or in a second, simplified solution, on the dichromatic (BY) approach, by mixing yellow and blue colors, in which case the yellow secondary component of the output light may be provided by a yellow phosphor and the blue component may be provided by a phosphor or by the primary emission of a blue light emitting diode.

In particular, the dichromatic approach as disclosed in, for example, U.S. Pat. No. 5,998,925 uses a blue light emitting diode of InGaN based semiconductor material combined with an $Y_3Al_5O_{12}$:Ce (YAG-$Ce^{3+}$) phosphor. The YAG-$Ce^{3+}$ phosphor is provided in a coating on the InGaN LED, and a portion of the blue light emitted from the LED is converted to yellow light by the phosphor. Another portion of the blue light from the LED is transmitted through the phosphor. Thus, this system emits both blue light, emitted from the LED, and yellow light emitted from the phosphor. The mixture of blue and yellow emission bands is perceived by an observer as white light with a typical CRI in the middle 70 ties and a color temperature Tc, that ranges from about 6000 K to about 8000 K.

Recent advances in manufacturing nitride-based LEDs have resulted in highly efficient light sources, and their efficiency is expected to surpass filament and fluorescent based light sources. Yet, all over efficiency is a recognized problem with phosphor-converted illumination systems, especially systems comprising light emitting diodes as their radiation source.

BRIEF SUMMARY OF THE INVENTION

There is accordingly a need to provide illumination systems comprising new phosphors that are excitable with high efficiency by a radiation source emitting primary radiation in a wavelength range of the near UV-to-blue range of the electromagnetic spectrum and convert that radiation into the visible yellow to red range.

Thus the present invention provides an illumination system, comprising a radiation source and a luminescent material comprising at least one phosphor capable of absorbing a portion of light emitted by the radiation source and emitting light of a wavelength different from that of the absorbed light; wherein said at least one phosphor is a cerium(III)-activated alkaline earth oxonitridoaluminosilicate of general formula $Ca_{1-x-y}A_xAl_{1+a-b}B_bSi_{1-a}N_{3-a}O_a$:$Ce_y$, wherein A represents a variable and is selected from the group comprising beryllium, magnesium, strontium, barium, zinc, manganese, lithium, sodium, potassium, rubidium, praseodymium, samarium, and europium, and B represents a variable and is selected from the group comprising boron, gallium, and scandium and wherein $0 \leq x \leq 1$; $0 < y \leq 0.2$; $0.001 \leq a \leq 1$ and $0.001 \leq b \leq 1$.

Such an illumination system has desirable characteristics for general lighting purposes providing high brightness at economical cost.

The efficiency of an illumination system using a source of primary radiation and a phosphor, which converts primary radiation into secondary radiation, is especially dependent on the efficiency of this luminescence conversion process.

A luminescence conversion process may be characterized by a number of parameters, including extinction coefficient, excitation, and emission spectrum, Stokes' shift, and quantum yield. An extinction coefficient is a wavelength-dependent measure of the absorbing power of a phosphor. An excitation spectrum is the dependence of emission intensity on the excitation wavelength, measured at a single constant emission wavelength. An emission spectrum is the wavelength distribution of the emission, measured after excitation with a single constant excitation wavelength. Stoke's shift is the difference in wavelengths between the maximum of the emission spectrum and the maximum of the absorption spectrum. A quantum yield is the ratio of the number of photons emitted to the number of photons absorbed by a phosphor.

The efficiency of a radiation conversion process per se is especially dependent on the difference in wavelength between the primary radiation source and the excitation wavelength of the phosphor, i.e. the Stokes' shift.

The phosphors according to the invention have an unusual broad continuous and unstructured excitation band in the blue and UVA range of the electromagnetic spectrum.

Due to the broad continuous excitation spectrum the phosphor system described in the invention has a very small Stokes shift and is therefore efficiently excitable with pump light in a wavelength range from 200 nm up to a wavelength of 500 nm. The quantum loss caused by the conversion of a primary photon emitted by the radiation source into a secondary yellow to red photon can therefore be minimized.

This broad excitation spectrum permits the phosphors to be efficiently excited by wavelength-limited light sources, such as common lasers and arc lamps as well as light emitting diodes.

An illumination system according to the present invention can provide a composite white output light that is well balanced with respect to color. In particular, the composite white output light has a greater amount of emission in the red color range than the conventional illumination system. This characteristic makes the device ideal for applications in which a true color rendering together with high efficiency is required.

Such applications of the invention include inter alias traffic lighting, street lighting, security lighting, lighting of automated factories, and signal lighting for cars and traffic.

Especially contemplated as a radiation source is a light-emitting diode. The emission produced by a light-emitting diode typically has excellent monochromaticity, because of its narrow spectral half-width of its emission spectrum.

Yet, currently available light emitting diodes show strong variations in dominant wavelength, peak wavelength and x/y color coordinates of their narrow-band emission, because the manufacturing process leads to scattering in performance around the average values given in the data sheets.

Therefore, coupling blue or UV-light emitting diodes with conventional phosphors with narrow excitation band leads to binning problems in white LED manufacturing because LEDs differing in wavelength from sample to sample leads to variations in phosphor excitability and thus to white LEDs with widely spread color temperatures and efficiencies.

Coupling blue or UV-light emitting diodes with phosphors of the invention capable of absorbing primary radiation in a broad range of frequencies with equal efficiencies so as to obtain white light may result in a higher efficiency white solid-state light source.

The better compatibility of the broad band excitation band of the phosphor with the narrow emission maxima of the LEDs permits the light emitting diodes to excite at their emission maximum, rather than at longer wavelengths with lower extinction coefficients.

According to a first aspect of the invention, a white light illumination system comprises a blue-light emitting diode having a peak emission wavelength in the range of 400 to 480 nm as a radiation source and a luminescent material comprising at least one phosphor, that is a cerium(III)-activated alkaline earth oxonitridoaluminosilicate of general formula $Ca_{1-x-y}A_xAl_{1+a-b}B_bSi_{1-a}N_{3-a}O_a:Ce_y$, wherein A represents a variable and is selected from the group comprising beryllium, magnesium, strontium, barium, zinc, manganese, lithium, sodium, potassium, rubidium, praseodymium, samarium, and europium, and B represents a variable and is selected from the group comprising boron, gallium, and scandium and wherein $0 \leq x \leq 1$; $0 < y \leq 0.2$; $0.001 \leq a \leq 1$ and $0.001 \leq b \leq 1$.

Such an illumination system will provide white light in operation. The blue light emitted by the LED excites the phosphor, causing it to emit yellow, amber or red light. The blue light emitted by the LED is transmitted through the phosphor and is mixed with the yellow to amber or red light emitted by the phosphor. The viewer perceives the mixture of blue and yellow to amber or red light as white light.

An essential factor is that the excitation spectrum of yellow to red phosphors of the cerium(III)-activated alkaline earth oxonitridoaluminosilicate type is so broad-banded in the range from 400 to 480 nm, that these phosphors are sufficiently excited by all blue to violet light emitting diodes in the market. As the excitation spectrum of the phosphors according to the invention is centered on 450 nm, blue-LEDs emitting in that wavelength range are preferred.

According to one embodiment of the first aspect, the invention provides a white light illumination system comprising a blue-light emitting diode having a peak emission wavelength in the range of 400 to 480 nm as a radiation source and a luminescent material comprising a cerium(III)-activated alkaline earth oxonitridoaluminosilicate of general formula $Ca_{1-x-y}A_xAl_{1+a-b}B_bSi_{1-a}N_{3-a}O_a:Ce_y$, wherein A represents a variable and is selected from the group comprising beryllium, magnesium, strontium, barium, zinc, manganese, lithium, sodium, potassium, rubidium, praseodymium, samarium, and europium, and B represents a variable and is selected from the group comprising boron, gallium, and scandium and wherein $0 \leq x \leq 1$; $0 < y \leq 0.2$; $0.001 \leq a \leq 1$ and $0.001 \leq b \leq 1$ and at least one second phosphor.

When the luminescent material comprises a phosphor blend of a phosphor of the cerium(III)-activated alkaline earth oxonitridoaluminosilicate type and at least one second phosphor the color rendering of the white light illumination system according to the invention may be further improved.

In particular, the luminescent material of this embodiment may be a phosphor blend, comprising a cerium(III)-activated alkaline earth oxonitridoaluminosilicate of general formula $Ca_{1-x-y}A_xAl_{1+a-b}B_bSi_{1-a}N_{3-a}O_a:Ce_y$, wherein A represents a variable and is selected from the group comprising beryllium, magnesium, strontium, barium, zinc, manganese, lithium, sodium, potassium, rubidium, praseodymium, samarium, and europium, and B represents a variable and is selected from the group comprising boron, gallium, and scandium and wherein $0 \leq x \leq 1$; $0 < y \leq 0.2$; $0.001 \leq a \leq 1$ and $0.001 \leq b \leq 1$ and a red phosphor.

Such red phosphor may be selected from the group of Eu(II)-activated phosphors, comprising $(Ca_{1-x}Sr_x)S:Eu$, wherein $0 \leq x \leq 1$ and $(Sr_{1-x-y}Ba_xCa_y)_{2-z}Si_{5-a}Al_aN_{8-a}O_a:Eu_z$ wherein $0 \leq a < 5$, $0 < x \leq 1$, $0 \leq y \leq 1$ and $0 < z \leq 1$.

Alternatively, the luminescent material may be a phosphor blend, comprising cerium(III)-activated alkaline earth oxonitridoaluminosilicate of general formula $Ca_{1-x-y}A_xAl_{1+a-b}B_bSi_{1-a}N_{3-a}O_a:Ce_y$, wherein A represents a variable and is selected from the group comprising beryllium, magnesium, strontium, barium, zinc, manganese, lithium, sodium, potassium, rubidium, praseodymium, samarium, and europium, and B represents a variable and is selected from the group comprising boron, gallium, and scandium and wherein $0 \leq x \leq 1$; $0 < y \leq 0.2$; $0.001 \leq a \leq 1$ and $0.001 \leq b \leq 1$ and a yellow-to-green phosphor. Such a yellow-to-green phosphor may be selected from the group comprising $(Ba_{1-x}Sr_x)_2SiO_4:Eu$, wherein $0 \leq x \leq 1$, $SrGa_2S_4:Eu$, $SrSi_2N_2O_2:Eu$, $Ln_3Al_5O_{12}:Ce$, wherein Ln comprises lanthanum and all lanthanide metals, and $Y_3Al_5O_{12}:Ce$.

The emission spectrum of such a luminescent material comprising additional phosphors has the appropriate wavelengths to obtain together with the blue light of the LED and the yellow to red light of the cerium(III)-activated alkaline earth oxonitridoaluminosilicate type phosphor according to the invention a high quality white light with good color rendering at the required color temperature.

According to another embodiment of the invention there is provided a white light illumination system, wherein the radiation source is selected from those light emitting diodes having an emission with a peak emission wavelength in the UV-range of 200 to 400 nm and the luminescent material comprises at least one phosphor, that is a cerium(III)-activated alkaline earth oxonitridoaluminosilicate of general formula $Ca_{1-x-y}A_xAl_{1+a-b}B_bSi_{1-a}N_{3-a}O_a:Ce_y$, wherein A represents a variable and is selected from the group comprising beryllium, magnesium, strontium, barium, zinc, manganese, lithium, sodium, potassium, rubidium, praseodymium, samarium, and europium, and B represents a variable and selected from the group comprising boron, gallium, and scandium and wherein $0 \leq x \leq 1$; $0 < y \leq 0.2$; $0.001 \leq a \leq 1$ and $0.001 \leq b \leq 1$ and a second phosphor.

In one embodiment, the second phosphor is a blue phosphor selected from the group of $BaMgAl_{10}O_{17}:Eu$, $Ba_5SiO_4(Cl,Br)_6:Eu$ $CaLn_2S_4:Ce$, $(Sr,Ba,Ca)_5(PO_4)_3Cl:Eu$ and $LaSi_3N_5:Ce$.

In another embodiment, the second phosphor is a red phosphor red phosphor selected from the group $(Ca_{1-x}Sr_x)S:Eu$, wherein $0 \leq x \leq 1$ and $(Sr_{1-x-y}Ba_xCa_y)_{2-z}Si_{5-a}Al_aN_{8-a}O_a:Eu_z$ wherein $0 \leq a < 5.00$, $0 < x \leq 1$, $0 \leq y \leq 1$ and $0 < z \leq 0.09$.

In a further embodiment, the second phosphor is a yellow to green phosphor selected from the group comprising $(Ba_{1-x}Sr_x)_2SiO_4$:Eu, wherein $0 \leq x \leq 1$, $SrGa_2S_4$:Eu, $SrSi_2N_2O_2$:Eu, $Ln_3Al_5O_{12}$:Ce and YAG:$Ce^{3+}$.

An essential factor is that the excitation spectrum of yellow to red phosphors of the cerium(III)-activated alkaline earth oxonitridoaluminosilicate type is so broad-banded in the range from 200 to 400 nm, that they are sufficiently excited by all UV-violet light emitting diodes in the market.

In particular, the luminescent material according to this embodiment may comprise a white light emitting phosphor blend, comprising a cerium(III)-activated alkaline earth oxonitridoaluminosilicate of general formula $Ca_{1-x-y}A_x Al_{1+a-b}B_bSi_{1-a}N_{3-a}O_a$:$Ce_y$, wherein A represents a variable and is selected from the group comprising beryllium, magnesium, strontium, barium, zinc, manganese, lithium, sodium, potassium, rubidium, praseodymium, samarium, and europium, and B represents a variable and is selected from the group comprising boron, gallium, and scandium and wherein $0 \leq x \leq 1$; $0 < y \leq 0.2$; $0.001 \leq a \leq 1$ and $0.001 \leq b \leq 1$ and a blue phosphor.

Such blue phosphor may be selected from the group comprising $BaMgAl_{10}O_{17}$:Eu, $Ba_5SiO_4(Cl,Br)_6$:Eu, $CaLn_2S_4$:Ce, wherein Ln comprises lanthanum and the lanthanide metals, and $(Sr,Ba,Ca)_5(PO_4)_3Cl$:Eu.

A second aspect of the present invention provides an illumination system providing yellow, amber or red light. Applications of the invention include security lighting as well as signal lighting for cars and traffic.

Especially contemplated is a yellow, amber or red light illumination system, wherein the radiation source is selected from those blue light emitting diodes having an emission with a peak emission wavelength in the range of 400 to 480 nm a and the luminescent material comprises at least one phosphor, that is a cerium(III)-activated alkaline earth oxonitridoaluminosilicate of general formula $Ca_{1-x-y}A_xAl_{1+a-b}B_bSi_{1-a}N_{3-a}O_a$:$Ce_y$, wherein A represents a variable and is selected from the group comprising beryllium, magnesium, strontium, barium, zinc, manganese, lithium, sodium, potassium, rubidium, praseodymium, samarium, and europium, and B represents a variable and is selected from the group comprising boron, gallium, and scandium and wherein $0 \leq x \leq 1$; $0 < y \leq 0.2$; $0.001 \leq a \leq 1$ and $0.001 \leq b \leq 1$.

Also contemplated is a yellow to red light illumination system, wherein the radiation source is selected from the light emitting diodes having an emission with a peak emission wavelength in the UV-range of 200 to 400 nm and the luminescent material comprises at least one phosphor that is a cerium(III)-activated alkaline earth Oxonitridoaluminosilicate of general formula $Ca_{1-x-y}A_xAl_{1+a-b}B_bSi_{1-a}N_{3-a}O_a$:$Ce_y$, wherein A represents a variable and is selected from the group comprising beryllium, magnesium, strontium, barium, zinc, manganese, lithium, sodium, potassium, rubidium, praseodymium, samarium, and europium, and B represents a variable and is selected from the group comprising boron, gallium, and scandium and wherein $0 \leq x \leq 1$; $0 < y \leq 0.2$; $0.001 \leq a \leq 1$ and $0.001 \leq b \leq 1$.

Another aspect of the present invention provides a phosphor capable of absorbing a portion of the light emitted by the radiation source and emitting light of a wavelength different from that of the absorbed light; wherein said phosphor is a cerium(III)-activated alkaline earth oxonitridoaluminosilicate of general formula $Ca_{1-x-y}A_xAl_{1+a-b}B_bSi_{1-a}N_{3-a}O_a$:$Ce_y$, wherein A represents a variable and is selected from the group comprising beryllium, magnesium, strontium, barium, zinc, manganese, lithium, sodium, potassium, rubidium, praseodymium, samarium, and europium, and B represents a variable and is selected from the group comprising boron, gallium, and scandium and wherein $0 \leq x \leq 1$; $0 < y \leq 0.2$; $0.001 \leq a \leq 1$ and $0.001 \leq b \leq 1$.

The luminescent material is excitable by UV radiation, which has such wavelengths as from 200 nm to 400 nm, but is excited with higher efficiency by blue light emitted by a blue light emitting diode having a wavelength around 400 to 480 nm Thus the luminescent material has ideal characteristics for conversion of blue light of nitride semiconductor light emitting component into white light.

These cerium(III)-activated alkaline earth oxonitridoaluminosilicate phosphors emit fast decaying secondary radiation in a broad band in the red to yellow spectral range of the visible spectrum, when excited by primary radiation. The visible emission is so broad that there are no 80 nm wavelength ranges where the visible emission is predominantly located.

The radiation conversion process occurs with very high efficiency, as the excitation spectrum of the phosphors according to the invention comprises a broad band in the UVA/blue region of the electromagnetic spectrum. The energy losses associated with the decrease in frequency of the emitted secondary radiation with regard to the absorbed primary radiation, can be kept to a minimum. Total conversion efficiency may be up to 90%.

Additional important characteristics of the phosphors include 1) resistance to thermal quenching of luminescence at typical device operating temperatures (e.g. 80° C.); 2) lack of interfering reactivity with the encapsulating resins used in the device fabrication and moisture; 3) suitable absorptive profiles to minimize dead absorption within the visible spectrum; 4) a temporally stable luminous output over the operating lifetime of the device and; 5) compositionally controlled tuning of the phosphors excitation and emission properties.

In particular, the invention relates to specific phosphor composition $Ca_{0.98}Al_{1.01}B_{0.01}Si_{0.98}N_{2.98}O_{0.02}$:$Ce_{0.02}$ which exhibit a high quantum efficiency of 80-90%, high absorbance in the range from 300 nm to 500 nm of 60 to 80%, an emission spectrum with a peak wave length of about 560 to 660 nm and low losses, i.e. below 10% of the luminescent lumen output due to thermal quenching from room temperature to 500° C.

A specific phosphor composition $Ca_{0.98}Al_{1.01}B_{0.01}Si_{0.98}N_{2.98}O_{0.02}$:$Ce_{0.02}$ is especially valuable as phosphor in white light emitting phosphor converted LEDs with low color temperature and improved color rendering.

DETAILED DESCRIPTION OF THE INVENTION

The Cerium(III)-Activated Alkaline Earth Oxonitridoaluminosilicate Phosphor

The present invention focuses on a cerium(III)-activated alkaline earth oxonitridoaluminosilicate as a phosphor in any configuration of an illumination system containing a radiation source, including, but not limited to discharge lamps, luminescent lamps, LEDs, LDs and X-ray tubes. As used herein, the term "radiation" encompasses preferably radiation in the UV and visible regions of the electromagnetic spectrum.

The luminescent material according to the invention comprises as a cerium(III)-activated alkaline earth oxonitridoaluminosilicate. The phosphor conforms to the general formula $Ca_{1-x-y}A_xAl_{1+a-b}B_bSi_{1-a}N_{3-a}O_a$:$Ce_y$, wherein A represents a variable and is selected from the group comprising beryllium, magnesium, strontium, barium, zinc, manganese, lithium, sodium, potassium, rubidium, praseodymium, samarium, and europium, and B is selected from the group comprising boron, gallium, and scandium and wherein $0 \leq x \leq 1$; $0 < y \leq 0.2$; $0.001 \leq a \leq 1$ and $0.001 \leq b \leq 1$.

This class of phosphor material is based on an activated luminescence of a substituted alkaline earth oxonitridoaluminosilicate.

The phosphor of general formula $Ca_{1-x-y}A_xAl_{1+a-b}B_bSi_{1-a}N_{3-a}O_a:Ce_y$, wherein A represents a variable and is selected from the group comprising beryllium, magnesium, strontium, barium, zinc, manganese, lithium, sodium, potassium, rubidium, praseodymium, samarium, and europium, and B represents a variable and is selected from the group comprising boron, gallium, and scandium and wherein $0 \leq x \leq 1$; $0 < y \leq 0.2$; $0.001 \leq a \leq 1$ and $0.001 \leq b \leq 1$ comprises a host lattice of the $NaSi_2N_3$ structure type. This structure type comprises in a unit cell eight nitrogen atoms that are connected threefold to silicon or aluminum atoms and four nitrogen atom that are connected twofold to silicon or aluminum atoms The nitrogen in the crystal sites of twofold-coordinated nitrogen can be substituted by oxygen to form oxygen-comprising phases. The calcium cations occupy crystal sites with sixfold coordination as shown in FIG. 3.

Part of the calcium cations in the lattice sites of the host lattice is replaced by the activator ion cerium(III). Substitution of Ca(II) by Ce(III) leads to the creation of charge in the lattice. The charge can be compensated by either co-doping with monovalent alkaline cations 1.), or by changing the O/N ratio in the SiAlON phase 2.), or by changing the Si/Al ratio in the SiAlON phase 3.):

1.) $Ce_{Ca}^{\bullet} + Na_{Ca}'$
2.) $Ce_{Ca}^{\bullet} + N_O'$
3.) $Ce_{Ca}^{\bullet} + Al_{Si}'$ Calcium can also be partly substituted by strontium and/or barium in an amount up to 10 mol % and can be fully substituted by magnesium. While incorporation of strontium and barium leads to a slight red shift of the emission, the incorporation of magnesium leads to a blue shift of the emission. Part of the calcium cations may also be substituted by zinc or manganese.

Part or all of the aluminum present can be substituted by boron, gallium and scandium.

Additional doping is possible with praseodymium(III), europium(II) and samarium(III) to enhance the red emission.

The proportion y of cerium(III) is preferably in a range of $0.001 < y < 0.2$. When the proportion y of cerium(III) is 0.001 or lower, luminance decreases because the number of excited emission centers of photoluminescence due to cerium(III)-cations decreases and, when the y is greater than 0.2, density quenching occurs. Density quenching refers to the decrease in emission intensity, which occurs when the concentration of an activation agent added to increase the luminance of the luminescent material is increased beyond an optimum level.

The method of producing a cerium(III)-activated alkaline earth oxonitridoaluminosilicate phosphor of the present invention is not particularly restricted. It may be produced by any method, capable of providing phosphors according to the invention. A series of compositions of general formula $Ca_{1-x-y}A_xAl_{1+a-b}B_bSi_{1-a}N_{3-a}O_a:Ce_y$, wherein A represents a variable and is selected from the group comprising beryllium, magnesium, strontium, barium, zinc, manganese, lithium, sodium, potassium, rubidium, praseodymium, samarium, and europium, and B represents a variable and selected from the group comprising boron, gallium, and scandium and wherein $0 \leq x \leq 1$; $0 < y \leq 0.2$; $0.001 \leq a \leq 1$ and $0.001 \leq b \leq 1$ can be manufactured, which form a complete solid solution.

A preferred process for producing a phosphor according to the invention is referred to as the solid-state method. In this process, the phosphor precursor materials are mixed in the solid state and are heated so that the precursors react and form a powder of the phosphor material.

In a specific embodiment, these yellow to red emitting phosphors are prepared as phosphor powders by the following technique:

For this, alkaline earth metal nitrides are mixed with silicon nitride $Si_3N_4$, aluminium nitride and cerium(III) fluoride as a dopant and a flux in predetermined ratios.

The mixture is placed into a high purity alumina crucible. The crucibles are loaded into a tube furnace and purged with flowing nitrogen/hydrogen for several hours. The furnace parameters are 10° C./min rising to 1450° C., followed by a 4 hour dwell at 1450° C. after which the furnace is slowly cooled down to room temperature.

The samples are finely ground before a second annealing step at 1600° C. is performed.

Luminous output may be improved through an additional third anneal at a slightly lower temperatures in flowing argon.

In another method, phosphor powder particle precursors or phosphor particles are dispersed in slurry, which is then spray-dried to evaporate the liquid. The particles are then sintered in the solid state at an elevated temperature to crystallize the powder and form a phosphor. The spray-dried powder is then converted to an oxonitridoaluminosilicate phosphor by sintering at an elevated temperature to crystallize the powder and to form the phosphor. The fired powder is lightly crushed and milled to recover phosphor particles of desired particle size.

Subsequently the resulting luminescent material is ground again, washed with water and ethanol, dried and sieved.

After firing, the powders were characterized by powder X-ray diffraction (Cu, Kα-line), which showed that all compounds had formed.

Cerium (III)-activated alkaline earth oxonitridoaluminosilicate type phosphors are because of their alkaline earth oxonitridoaluminosilicate host lattice, resistant to heat, light and moisture.

Resistance to thermally enhanced photodegradation is of importance as light-emitting diodes under operation can become very hot and any material surrounding the LED will also become hot. The heat can damage a conventional phosphor surrounding the LED, degrading its ability to down-convert the LED's light. The phosphors according to the invention are heat resistant and suited for applications up to 500° C.

These cerium(III)-activated alkaline earth oxonitridoaluminosilicate phosphors are responsive to broad energetic portions of the electromagnetic spectrum within the UV- and visible blue portion of the electromagnetic spectrum.

In particular, the phosphors according to the invention are especially excitable by a radiation source providing UV-emission with such wavelengths as from 200 to 400 nm, such as an UV-LED, but are excited with higher efficiency by a radiation source providing blue light having a wavelength from 400 to 480 nm, such as a blue-emitting LED. As shown in FIG. 2 the excitation spectrum of this type of phosphors closely resembles a continuum. Thus the luminescent material has ideal characteristics for converting blue light of nitride semiconductor light-emitting diodes into white light.

Each phosphor of the cerium(III)-activated alkaline earth oxonitridoaluminosilicate type emits a yellow, amber, or red fluorescence when excited by radiation of the UVA or blue range of the electromagnetic spectrum.

When excited by radiation of 460 nm, cerium(III)-activated alkaline earth oxonitridoaluminosilicate phosphors are found to release energy in form of a broadband emission in the yellow, amber or red range of the electromagnetic spectrum.

In FIG. 2 of the drawings accompanying this specification, the excitation and emission spectra of $Ca_{0.98}Al_{1.01}B_{0.01}Si_{0.98}N_{2.98}O_{0.02}:Ce_{0.02}$ are given. $Ca_{0.98}Al_{1.01}B_{0.01}Si_{0.98}N_{2.98}O_{0.02}:Ce_{0.02}$ has an emission spectrum with a peak wavelength at 615 nm and a tail emission up to 800 nm The Illumination System The invention also relates to an illumination system comprising a radiation source and a luminescent material comprising at least one cerium(III)-activated alkaline earth oxonitridoaluminosilicate of general formula $Ca_{1-x-y}A_x Al_{1+a-b}B_bSi_{1-a}N_{3-a}O_a:Ce_y$, wherein A represents a variable and is selected from the group comprising beryllium, magnesium, strontium, barium, zinc, manganese, lithium, sodium, potassium, rubidium, praseodymium, samarium, and europium, and B represents a variable and is selected from the group comprising boron, gallium, and scandium and wherein $0 \le x \le 1$; $0 < y \le 0.2$; $0.001 \le a \le 1$ and $0.001 \le b \le 1$.

Radiation sources include semiconductor optical radiation emitters and other devices that emit optical radiation in response to electrical excitation. Semiconductor optical radiation emitters include light emitting diode LED chips, light emitting polymers (LEPs), organic light emitting devices (OLEDs), polymer light emitting devices (PLEDs), laser diodes (LDs) etc.

Moreover, light-emitting components such as those found in discharge lamps and luminescent lamps, such as mercury low and high pressure discharge lamps, sulfur discharge lamps, and discharge lamps based an molecular radiators are also contemplated for use as radiation sources with the present inventive phosphor compositions.

In a preferred embodiment of the invention the radiation source is a light-emitting diode (LED). It is one of the advantages of the invention that it provides different colors and hues of light sources by using various ratios and types of phosphor blends in an assembly with one or more light emitting diodes.

Any configuration of an illumination system which includes a light emitting diode and a cerium(III) activated alkaline earth oxonitridoaluminosilicate phosphor composition is contemplated in the present invention, preferably with addition of other well-known phosphors, which can be combined to achieve a specific color or white light when irradiated by a LED emitting primary UV or blue light as specified above.

A detailed construction of one embodiment of such illumination system comprising a radiation source and a luminescent material shown in FIG. 1 will now be described.

FIG. 1 is a schematic view of a chip type light emitting diode with a coating comprising the luminescent material. The device comprises chip type light emitting diode 1 as a radiation source. The light-emitting diode dice is positioned in a reflector cup lead frame 2. The dice 1 is connected via a bond wire 7 to a first terminal 6, and directly to a second electric terminal 6'. The recess of the reflector cup is filled with a coating material that contains a luminescent material according to the invention to form a coating layer that is embedded in the reflector cup. The phosphors are applied either separately or in a mixture.

The coating material typically comprises a polymer 5 for encapsulating the phosphor or phosphor blend 3. In this embodiment, the phosphor or phosphor blend should exhibit high stability properties against the encapsulant. Preferably, the polymer is optically clear to prevent any significant light scattering. A variety of polymers are known in the LED industry for making LED illumination systems.

In one embodiment, the polymer is selected from the group consisting of epoxy and silicone resins. Adding the phosphor mixture to a liquid that is a polymer precursor can lead to encapsulation. For example, the phosphor mixture may be a granular powder. Introducing phosphor particles into polymer precursor liquid results in formation of a slurry (i.e. a suspension of particles). Upon polymerization, the phosphor mixture is fixed rigidly in place by the encapsulation. In one embodiment, both the luminescent material and the LED dice are encapsulated in the polymer.

The transparent coating material may comprise light-diffusing particles 4, advantageously so-called diffusers. Examples of such diffusers are mineral fillers, in particular $ZrO_2$, $CaF_2$, $TiO_2$, $SiO_2$, $CaCO_3$ or $BaSO_4$, or organic pigments. These materials can be added in a simple manner to the above-mentioned resins.

In operation, electrical power is supplied to the dice to activate the dice. When activated, the dice emits the primary light, e.g. blue light. A portion of the emitted primary light is completely or partially absorbed by the luminescent material in the coating layer. The luminescent material then emits secondary light, i.e., the converted light having a longer peak wavelength, primarily yellow in a sufficiently broadband (specifically with a significant proportion of red) in response to absorption of the primary light. The remaining unabsorbed portion of the emitted primary light is transmitted through the luminescent layer, along with the secondary light. The encapsulation directs the unabsorbed primary light and the secondary light in a general direction as output light. Thus, the output light is a composite light that is composed of the primary light emitted from the die and the secondary light emitted from the luminescent layer.

The color temperature or color point of the output light of an illumination system according to the invention will vary depending upon the spectral distributions and intensities of the secondary light in comparison to the primary light.

Firstly, the color temperature or color point of the primary light can be varied by a suitable choice of the light emitting diode.

Secondly, the color temperature or color point of the secondary light can be varied by a suitable choice of the phosphor in the luminescent material, its particle size and its concentration. Furthermore, these arrangements also advantageously afford the possibility of using phosphor blends in the luminescent material, as a result of which, advantageously, the desired hue can be set even more accurately.

The White Light Phosphor-Converted Light-Emitting Device

According to one aspect of the invention the output light of the illumination system may have a spectral distribution such that it appears to be "white" light.

The most popular white LED's consist of blue emitting LED chips that are coated with a phosphor that converts some of the blue radiation to a complimentary color, e.g. a yellow to amber emission. The blue and yellow emissions together produce white light.

There are also white LED's which utilize a UV emitting chip and phosphors designed to convert the UV radiation to visible light. Typically, two or more phosphor emission bands are required.

Blue/Phosphor White LED (Dichromatic White Light Phosphor-Converted Light-Emitting Device Using Blue Emitting Light Emitting Diode)

In a first embodiment, a white-light emitting illumination system according to the invention can advantageously be produced by choosing the luminescent material such that a blue radiation emitted by a blue light emitting diode is converted into complementary wavelength ranges, so as to form dichromatic (BY) white light.

In this case, yellow to red light is produced by means of the luminescent materials that comprise a cerium(III)-activated alkaline earth oxonitridoaluminosilicate phosphor. Also a second luminescent material may be used, in addition, in order to improve the color rendering of this illumination system.

Particularly good results are achieved with a blue LED whose emission maximum lies at 400 to 500 nm. An optimum was found to lie at 445 to 468 nm, taking particular account of the excitation spectrum of the cerium(III)-activated alkaline earth oxonitridoaluminosilicate.

The color output of the LED-phosphor system is very sensitive to the thickness of the phosphor layer, resp. the amount of phosphor in the phosphor layer. If the phosphor layer is thick and comprises an excess of a yellow to red cerium(III) activated alkaline earth oxonitridoaluminosilicate phosphor, then a lesser amount of the blue LED light will penetrate through the thick phosphor layer. The combined LED-phosphor system will then in operation appear yellowish to reddish white, because the yellow to red secondary light of the phosphor dominates. Therefore, the thickness of the phosphor layer is a variable, affecting the color output of the system. A large range of flexibility is available both for providing the desired chromaticity and controlling the color output of the individual devices.

In one specific embodiment a white-light emitting illumination system according to the invention can particularly preferably be realized by admixing the inorganic luminescent material $Ca_{0.98}Al_{1.01}B_{0.01}Si_{0.98}N_{2.98}O_{0.02}:Ce_{0.02}$ in various concentration to a silicon resin used to produce the luminescence conversion encapsulation or layer for a 440 nm InGaN light-emitting diode.

Part of a blue radiation emitted by a 462 nm InGaN light emitting diode is shifted by the inorganic luminescent material $Ca_{0.98}Al_{1.01}B_{0.01}Si_{0.98}N_{2.98}O_{0.02}:Ce_{0.02}$ into the yellow, amber or red spectral region and, consequently, into a wavelength range which is complementarily colored with respect to the color blue. A human observer perceives the combination of blue primary light and the secondary light of the yellow, amber or red-emitting phosphor as white light.

FIG. 4 shows the emission spectra of such an illumination system comprising blue emitting InGaN die with primary emission at 440 nm and $Ca_{0.98}Al_{1.01}B_{0.01}Si_{0.98}N_{2.98}O_{0.02}:Ce_{0.02}$ in various amounts as the luminescent material, which together form an overall spectrum which conveys a white color sensation of high quality.

The quality of light produced by a light source may be characterized by a color-rendering index CRI, which indicates how truly a light source renders colors. The color-rendering index is established by a visual experiment. First the color temperature CCT of a light source to be evaluated is determined. Eight standard color samples are then illuminated first by the light source, then by a light from a blackbody having the same color temperature. If a standard color sample does not change color, then the light source has a theoretically perfect color rendering index value of 100. The color-rendering index is usually termed "Ra" and is an average of the color rendering index values of all eight standard color samples.

These data and the corresponding color points are given in Table 1.

TABLE 1

| Obs: 2 deg. | LED440_1 | LED440_2 | LED440_4 | LED440_6 | LED440_8 |
|---|---|---|---|---|---|
| CCT | 14632 | 6659 | 3945 | 3356 | 3104 |
| x | 0.3054 | 0.3238 | 0.3573 | 0.3860 | 0.4099 |
| y | 0.2173 | 0.2422 | 0.2876 | 0.3264 | 0.3585 |
| CRI | 61 | 77 | 93 | 86 | 81 |
|  | 73 | 82 | 90 | 88 | 86 |
|  | 34 | 56 | 79 | 84 | 85 |
|  | 60 | 73 | 82 | 78 | 76 |
|  | 70 | 82 | 91 | 83 | 78 |
|  | 57 | 70 | 81 | 80 | 77 |
|  | 70 | 77 | 83 | 82 | 83 |
|  | 51 | 68 | 87 | 76 | 70 |
|  | −28 | 31 | 81 | 50 | 33 |
|  | 39 | 60 | 71 | 68 | 63 |
|  | 61 | 78 | 80 | 73 | 71 |
|  | 53 | 66 | 73 | 67 | 60 |
|  | 61 | 76 | 90 | 86 | 81 |
|  | 58 | 71 | 86 | 89 | 90 |
| Ra(8)= | 59 | 73 | 86 | 82 | 80 |

In a second specific embodiment a white-light emitting illumination system according to the invention can particularly preferably be realized by admixing the inorganic luminescent material $Ca_{0.98}Al_{1.01}B_{0.01}Si_{0.98}N_{2.98}O_{0.02}:Ce_{0.02}$ in various amounts to a silicon resin used to produce the luminescence conversion encapsulation or layer for a 456 nm InGaN light emitting diode or a 468 nm InGaN light emitting diode.

FIG. 5 shows the emission spectra of such illumination system comprising blue emitting InGaN die with primary emission at 456 nm and $Ca_{0.98}Al_{1.01}B_{0.01}Si_{0.98}N_{2.98}O_{0.02}:Ce_{0.02}$ as the luminescent material, which together form an overall spectrum which conveys a white color sensation of high quality. The corresponding data are given in Table 2:

TABLE 2

| Obs: 2 deg. | LED456_4 | LED456_7 | LED456_9 |
|---|---|---|---|
| CCT | 4970 | 3577 | 3263 |
| x | 0.3392 | 0.3818 | 0.4049 |
| y | 0.2816 | 0.3347 | 0.3632 |
| CRI | 85 | 92 | 86 |
|  | 85 | 95 | 94 |
|  | 93 | 94 | 94 |
|  | 88 | 81 | 78 |
|  | 86 | 89 | 84 |

TABLE 2-continued

| Obs: 2 deg. | LED456_4 | LED456_7 | LED456_9 |
|---|---|---|---|
| | 78 | 88 | 87 |
| | 88 | 85 | 85 |
| | 95 | 80 | 74 |
| | 76 | 63 | 44 |
| | 81 | 89 | 81 |
| | 81 | 73 | 71 |
| | 63 | 68 | 65 |
| | 83 | 94 | 89 |
| | 95 | 97 | 96 |
| Ra(8)= | 87 | 88 | 85 |

In a third specific embodiment, a white light-emitting illumination system according to the invention can particularly preferably be realized by admixing the inorganic luminescent material $Ca_{0.98}Al_{1.01}B_{0.01}Si_{0.98}N_{2.98}O_{0.02}:Ce_{0.02}$ in various concentration with a silicon resin used to produce the luminescence conversion encapsulation or layer for a 462 nm InGaN light emitting diode.

FIG. 6 shows the emission spectra of such illumination system comprising blue emitting InGaN die with primary emission at 468 nm and $Ca_{0.98}Al_{1.01}B_{0.01}Si_{0.98}N_{2.98}O_{0.02}:$ Ce0.02 as the luminescent material, which together form an overall spectrum, which conveys a white color sensation of high quality. The corresponding data are given in Table 3:

TABLE 3

| Obs: 2 deg. | LED468_2 | LED468_4 | LED468_6 | LED468_9 |
|---|---|---|---|---|
| CCT | 5150 | 4107 | 3614 | 3238 |
| x | 0.3385 | 0.3678 | 0.3924 | 0.4216 |
| y | 0.3098 | 0.3418 | 0.3684 | 0.3996 |
| CRI | 82 | 94 | 94 | 87 |
| | 73 | 85 | 93 | 98 |
| | 72 | 80 | 87 | 95 |
| | 71 | 76 | 76 | 76 |
| | 79 | 89 | 89 | 84 |
| | 68 | 80 | 90 | 94 |
| | 71 | 76 | 79 | 84 |
| | 81 | 78 | 76 | 72 |
| | 75 | 78 | 64 | 42 |
| | 51 | 75 | 91 | 89 |
| | 71 | 72 | 72 | 71 |
| | 47 | 60 | 68 | 70 |
| | 78 | 92 | 98 | 90 |
| | 88 | 91 | 94 | 98 |
| Ra(8)= | 75 | 82 | 86 | 86 |

(Polychromatic White-Light Phosphor-Converted Light-Emitting Device Using Blue Emitting Light-Emitting Diode)

In another embodiment, a white-light emitting illumination system according to the invention can advantageously be produced by choosing the luminescent material such that a blue radiation emitted by the blue light emitting diode is converted into complementary wavelength ranges, to form polychromatic especially trichromatic (RGB) white light. In this case, yellow to red and green light is produced by means of the luminescent materials that comprise a blend of phosphors including cerium(III)-activated alkaline earth oxonitridoaluminosilicate phosphor and a second phosphor.

A white light emission with high color rendering is made possible by the use of red and green broadband emitter phosphors covering the entire spectral range together with a blue-emitting LED. As a red broad band emitter a yellow to red emitting cerium(III)-activated alkaline earth oxonitridoaluminosilicate phosphor is used.

Useful green and second red phosphors and their optical properties are summarized in the following Table 4.

TABLE 4

| Composition | $\lambda_{max}$ [nm] | Color point x, y |
|---|---|---|
| $(Ba_{1-x}Sr_x)_2SiO_4$: Eu | 523 | 0.272, 0.640 |
| $SrGa_2S_4$: Eu | 535 | 0.270, 0.686 |
| $SrSi_2N_2O_2$: Eu | 541 | 0.356, 0.606 |
| SrS: Eu | 610 | 0.627, 0.372 |
| $(Sr_{1-x-y}Ca_xBa_y)_2Si_5N_8$: Eu | 615 | 0.615, 0.384 |
| $(Sr_{1-x-y}Ca_xBa_y)_2Si_{5-a}Al_aN_{8-a}O_a$: Eu | 615-650 | * |
| CaS: Eu | 655 | 0.700, 0.303 |
| $(Sr_{1-x}Ca_x)S$: Eu | 610-655 | * |

The luminescent materials may be a blend two phosphors, a yellow to red cerium(III) activated alkaline earth oxonitridoaluminosilicate phosphor and a green phosphor selected from the group comprising $(Ba_{1-x}Sr_x)_2SiO_4$:Eu, wherein 0≤x≤1, $SrGa_2S_4$:Eu and $SrSi_2N_2O_2$:Eu.

The luminescent materials for an illumination system using a blue emitting LED for providing polychromatic white light may also be a blend of three (or more) phosphors, e.g. a yellow to red cerium(III) activated alkaline earth oxonitridoaluminosilicate phosphor, a red phosphor selected from the group $(Ca_{1-x}Sr_x)S$:Eu, wherein 0≤x≤1 and $(Sr_{1-x-y}Ba_xCa_y)_2Si_{5-a}Al_aN_{8-a}O_a$:Eu wherein 0≤a<5, 0<x≤1 and 0≤y≤1 and a green phosphor selected from the group comprising $(Ba_{1-x}Sr_x)_2SiO_4$:Eu, wherein 0≤x≤1, $SrGa_2S_4$:Eu and $SrSi_2N_2O_2$:Eu.

The hue (color point in the CIE chromaticity diagram) of the white light thus produced can be varied in this embodiment by a suitable choice of the phosphors as regards their mixture and concentration.

UV/Phosphor White LED (Dichromatic White Phosphor Converted Light Emitting Device Using UV-Emitting Light Emitting Diodes)

In another embodiment, a white-light emitting illumination system according to the invention can advantageously be produced by choosing the luminescent material such that a UV radiation emitted by the UV light emitting diode is converted into complementary wavelength ranges, to form dichromatic white light. In this case, the yellow and blue light is produced by means of the luminescent materials. Yellow to red light is produced by means of the luminescent materials that comprise a cerium(III)-activated alkaline earth oxonitridoaluminosilicate phosphor. Blue light is produced by means of the luminescent materials that comprise a blue phosphor selected from the group comprising $BaMgAl_{10}O_{17}$:Eu, $Ba_5SiO_4(Cl,Br)_6$:Eu, $CaLn_2S_4$:Ce and $(Sr,Ba,Ca)_5(PO_4)_3Cl$:Eu.

Particularly good results are achieved using a UVA light emitting diode, whose emission maximum lies at 300 to 400 nm. An optimum was found to lie at 365 nm, taking particular account of the excitation spectrum of the cerium(III)-activated alkaline earth oxonitridoaluminosilicate.

Polychromatic White Phosphor Converted Light Emitting Device Using UV Emitting-LED In a specific embodiment, a white-light emitting illumination system according to the invention can advantageously be produced by choosing the luminescent material such that UV radiation emitted by a UV emitting diode is converted into complementary wavelength ranges, so as to form polychromatic white light e.g. by additive color triads, for example blue, green and red.

In this case, the yellow to red, the green and blue light is produced by means of the luminescent materials.

A white light emission with especially high color rendering is possible by using blue and green broad band emitter phosphors, covering the whole spectral range, together with a UV emitting LED and a yellow to red emitting cerium(III)-activated alkaline earth oxonitridoaluminosilicate phosphor.

The luminescent materials may be a blend of a yellow to red cerium(III) activated alkaline earth oxonitridoaluminosilicate phosphor, a blue phosphor selected from the group comprising BaMgAl$_{10}$O$_{17}$:Eu, Ba$_5$SiO$_4$(Cl,Br)$_6$:Eu, CaLn$_2$S$_4$:Ce and (Sr,Ba,Ca)$_5$(PO$_4$)$_3$Cl:Eu and a green phosphor selected from the group comprising (Ba$_{1-x}$Sr$_x$)$_2$SiO$_4$:Eu, wherein 0≤x≤1, SrGa$_2$S$_4$:Eu and SrSi$_2$N$_2$O$_2$:Eu. A second red luminescent material can be used, in addition, in order to improve the color rendering of this illumination system.

The hue (color point in the CIE chromaticity diagram) of the white light thereby produced can in this case be varied by a suitable choice of the phosphors with regard to mixture and concentration.

The Yellow to Red Phosphor Converted Light Emitting Device

A further aspect of the invention relates to an illumination system that emits output light having a spectral distribution such that it appears to be "yellow to red" light.

A luminescent material comprising cerium(III) activated alkaline earth oxonitridoaluminosilicate as phosphor is particularly well suited as a yellow to red component for stimulation by a primary UVA or blue radiation source such as, for example, an UVA-emitting LED or blue-emitting LED. It is possible thereby to implement an illumination system emitting in the yellow to red regions of the electromagnetic spectrum.

In one embodiment of this aspect of the invention, a yellow-light emitting illumination system can advantageously be produced by choosing the luminescent material such that a blue radiation emitted by the blue light emitting diode is converted into complementary wavelength ranges, so as to form dichromatic yellow light.

In this case, yellow light is produced by the luminescent materials that comprise a cerium(III)-activated alkaline earth oxonitridoaluminosilicate phosphor.

Particularly good results are achieved with a blue LED whose emission maximum lies at 400 to 480 nm. An optimum was found to lie at 445 to 465 nm, taking particular account of the excitation spectrum of the alkaline earth oxonitridoaluminosilicate.

A yellow-light emitting illumination system according to the invention can particularly preferably be realized by admixing an excess quantity of the inorganic luminescent material Ca$_{0.98}$Al$_{1.01}$B$_{0.01}$Si$_{0.98}$N$_{2.98}$O$_{0.02}$:Ce$_{0.02}$ with a silicon resin used to produce the luminescence conversion encapsulation or layer. Part of a blue radiation emitted by a 462 nm InGaN light emitting diode is shifted by the inorganic luminescent material Ca$_{0.98}$Al$_{1.01}$B$_{0.01}$Si$_{0.98}$N$_{2.98}$O$_{0.02}$:Ce$_{0.02}$ into the yellow spectral region and, consequently, into a wavelength range complementarily colored to the color blue. A human observer perceives the combination of blue primary light and the excess secondary light of the yellow-emitting phosphor as yellow light.

The color output of the LED-phosphor system is very sensitive to the thickness of the phosphor layer, if the phosphor layer is thick and comprises an excess of a yellow cerium(III) activated alkaline earth oxonitridoaluminosilicate phosphor, then a lesser amount of the blue LED light will penetrate through the thick phosphor layer. The combined LED-phosphor system will then appear yellow to red, because the yellow to red secondary light of the phosphor dominates it. Therefore, the thickness of the phosphor layer is a variable affecting the color output of the system.

The hue (color point in the CIE chromaticity diagram) of the yellow light thereby produced can in this case be varied by a suitable choice of the phosphor in respect of mixture and concentration.

In a further embodiment of this aspect of the invention, choosing the luminescent material such that a UV radiation emitted by the UV emitting diode is converted entirely into monochromatic yellow to red light can advantageously produce a yellow to red-light emitting illumination system according to the invention. In this case, the yellow to red light is produced by means of the luminescent materials.

A yellow-light emitting illumination system according to the invention can particularly preferably be realized by admixing the inorganic luminescent material Ca$_{0.98}$Al$_{1.01}$B$_{0.01}$Si$_{0.98}$N$_{2.98}$O$_{0.02}$:Ce$_{0.02}$ with a silicon resin used to produce the luminescence conversion encapsulation or layer. Part of a blue radiation emitted by a 462 nm InGaN light emitting diode is shifted by the inorganic luminescent material Ca$_{0.98}$Al$_{1.01}$B$_{0.01}$Si$_{0.98}$N$_{2.98}$O$_{0.02}$:Ce$_{0.02}$ into the yellow spectral region. A human observer perceives the combination of UVA primary radiation and the secondary light of the yellow-emitting phosphor as yellow light.

The hue (color point in the CIE chromaticity diagram) of the white light thus produced can be varied by a suitable choice of the phosphor in respect of mixture and concentration.

Figure 1:
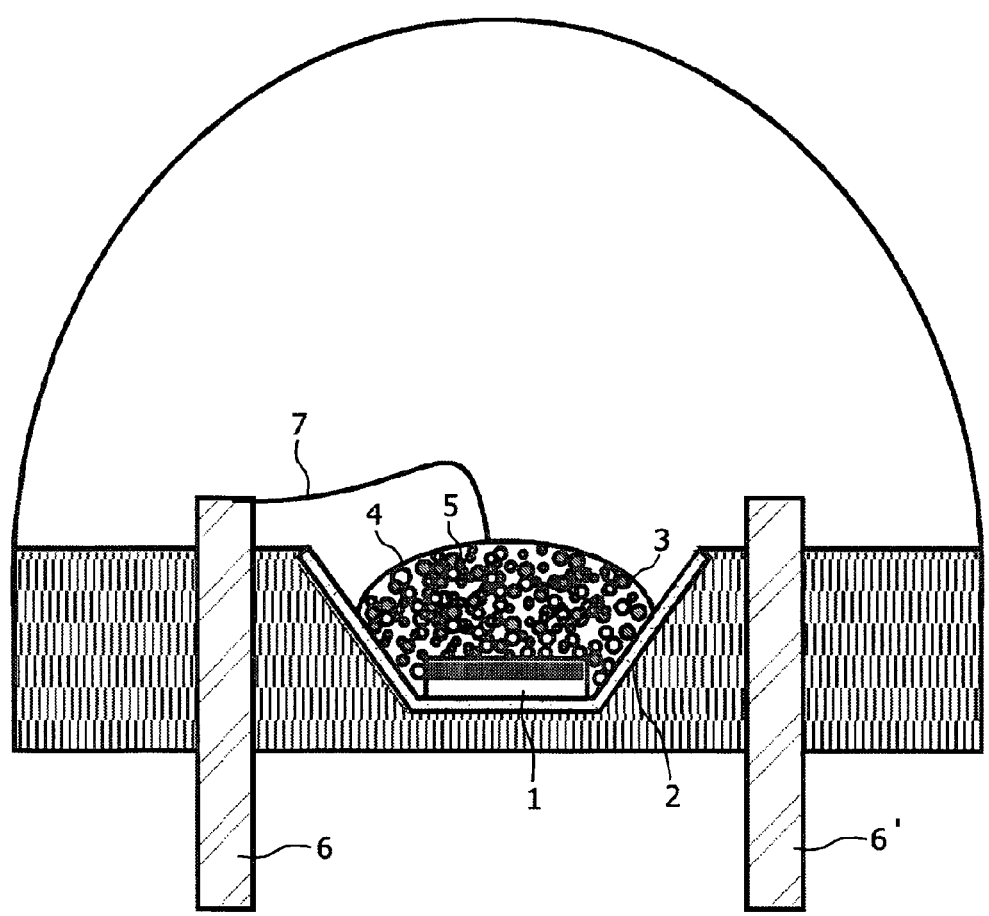
FIG. 1 is a schematic view of a dichromatic white LED lamp comprising a phosphor of the present invention positioned in a pathway of light emitted by an LED structure.
Figure 2:
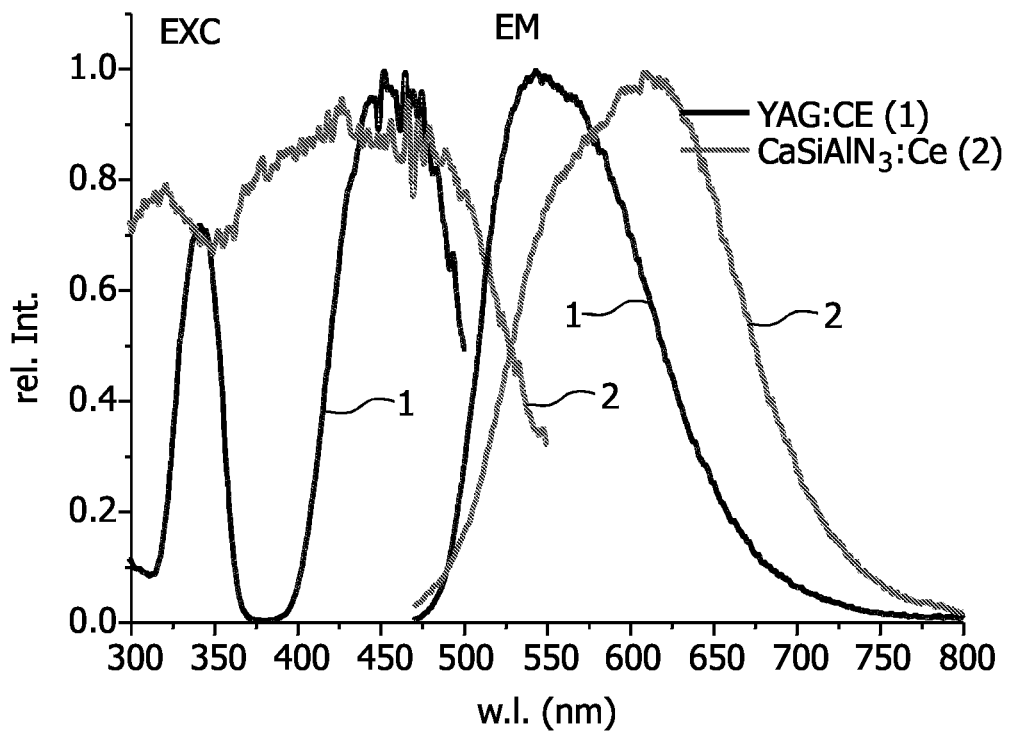
FIG. 2 is excitation and emission spectra of Ca$_{0.98}$Al$_{1.01}$B$_{0.01}$Si$_{0.98}$N$_{2.98}$O$_{0.02}$:Ce$_{0.02}$.
Figure 3:
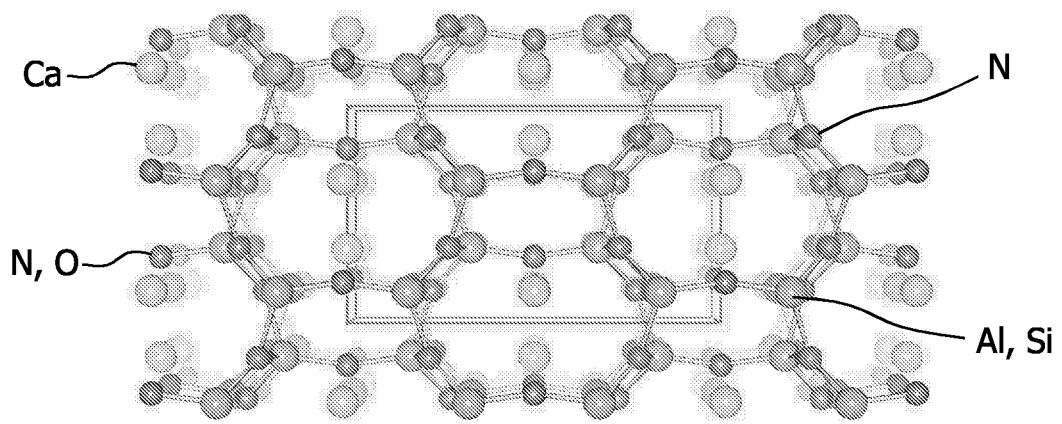
FIG. 3 shows a model of the crystal structure of CaAl$_{1+x}$Si$_{1-x}$N$_{3-x}$O$_x$.
Figure 4:
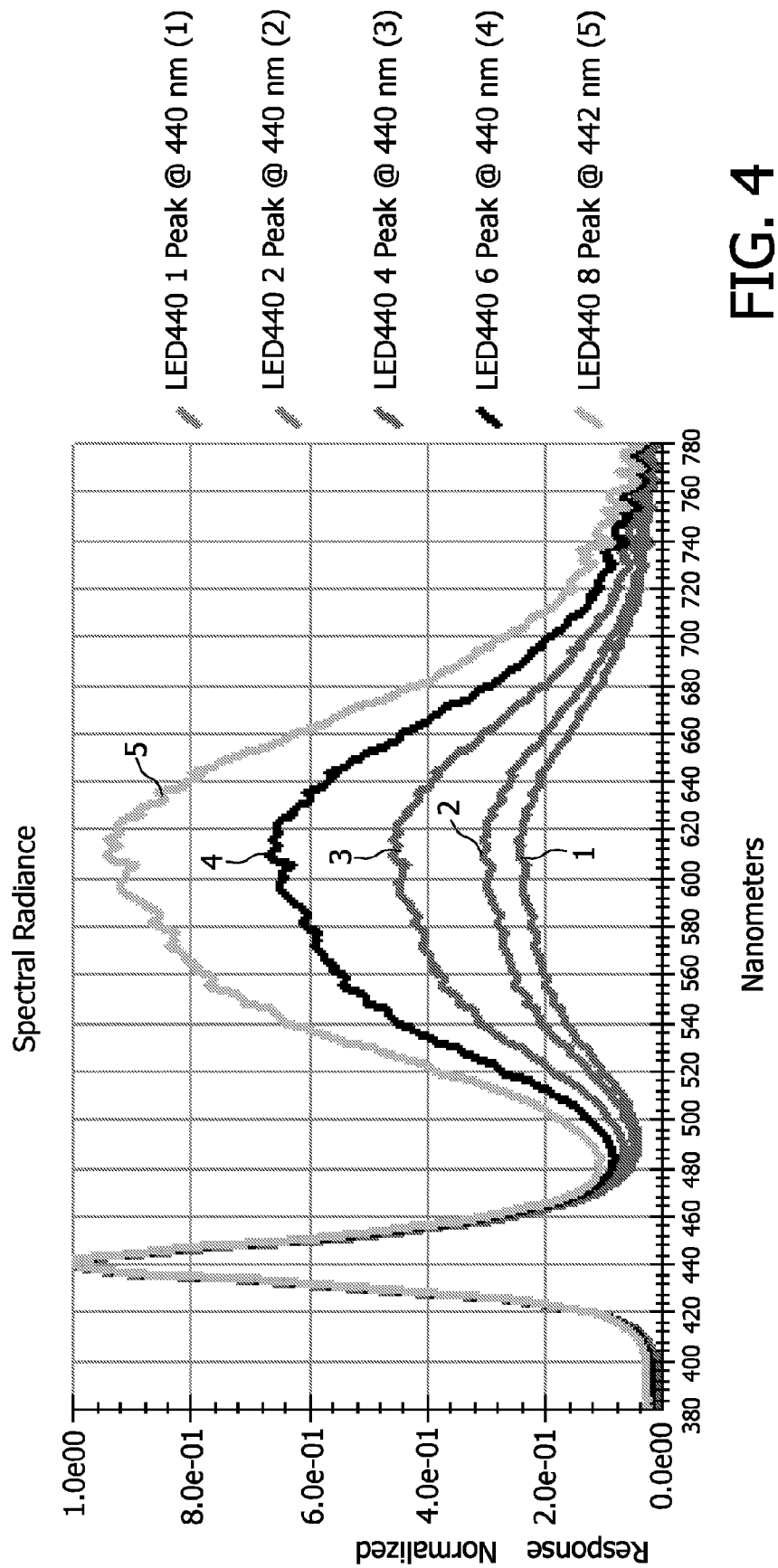
FIG. 4 shows the spectral radiance of an illumination system comprising a blue 440 nm LED and Ca$_{0.98}$Al$_{1.01}$B$_{0.01}$Si$_{0.98}$N$_{2.98}$O$_{0.02}$:Ce$_{0.02}$ as luminescent material in various concentrations.
Figure 5:
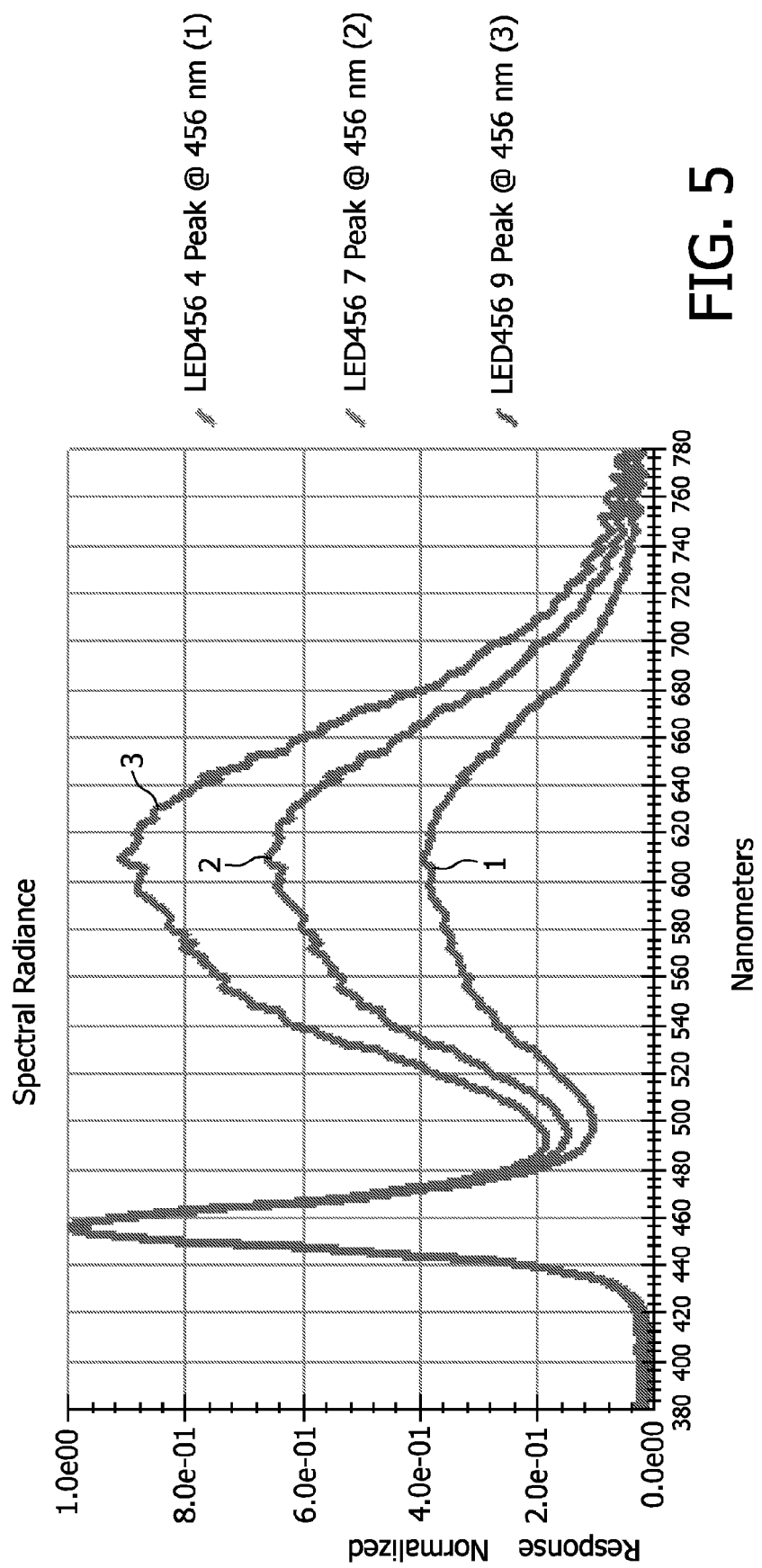
FIG. 5 shows the spectral radiance of an illumination system comprising a blue 456 nm LED and Ca$_{0.98}$Al$_{1.01}$B$_{0.01}$Si$_{0.98}$N$_{2.98}$O$_{0.02}$:Ce$_{0.02}$ as luminescent material in various concentrations.
Figure 6:
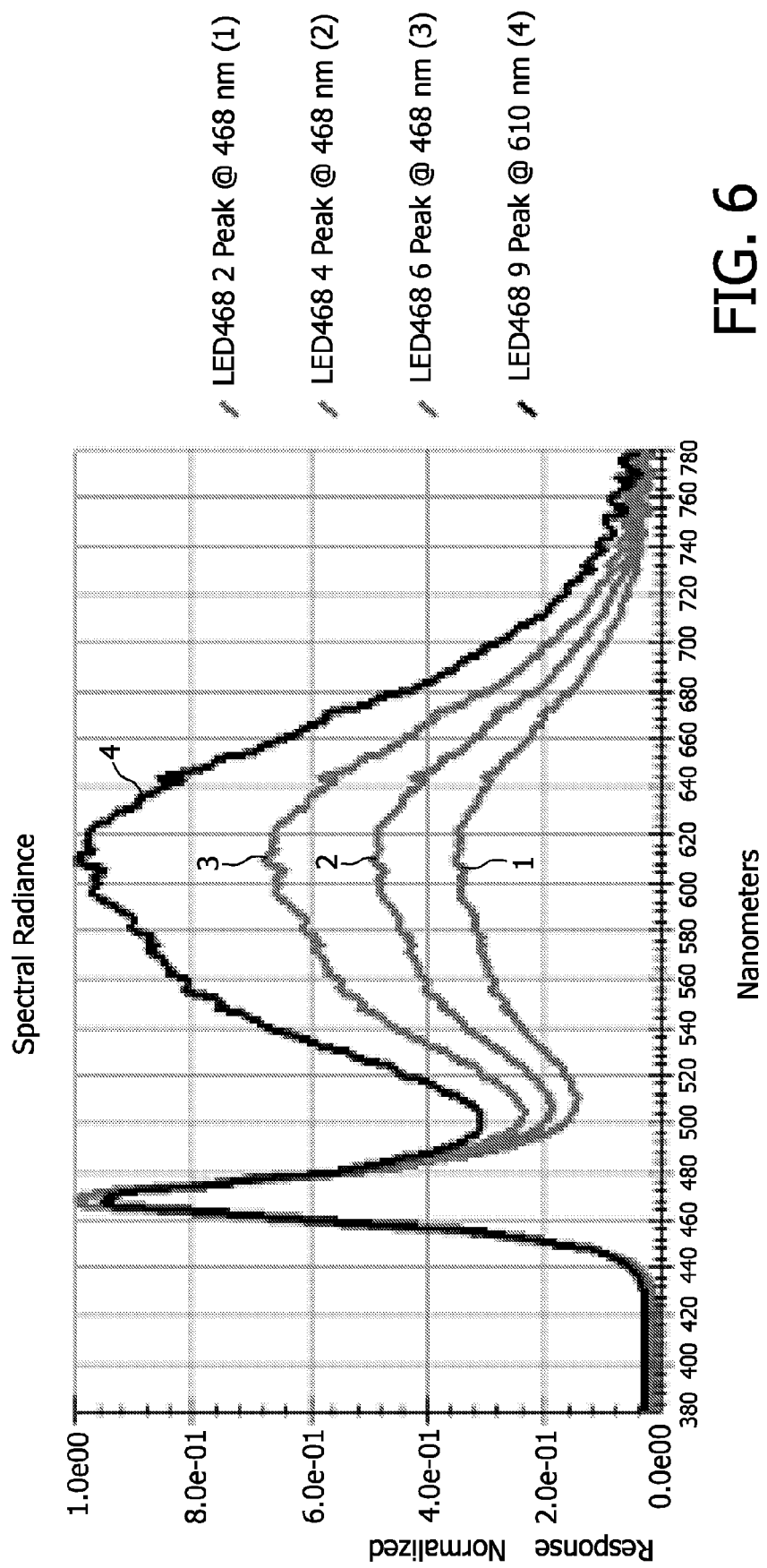
FIG. 6 shows the spectral radiance of an illumination system comprising a blue 468 nm LED and Ca$_{0.98}$Al$_{1.01}$B$_{0.01}$Si$_{0.98}$N$_{2.98}$O$_{0.02}$:Ce$_{0.02}$ as luminescent material in various concentrations.

The invention claimed is:

1. An illumination system, comprising:
   a radiation source; and
   a luminescent material comprising at least one phosphor capable of absorbing a portion of light emitted by the radiation source and emitting light of a wavelength different from that of the absorbed light;
   wherein said at least one phosphor is a cerium(III)-activated alkaline earth oxonitridoaluminosilicate of general formula Ca$_{1-x-y}$A$_x$Al$_{1+a-b}$B$_b$Si$_{1-a}$N$_{3-a}$O$_a$:Ce$_y$, wherein A represents a variable and is selected from the group consisting of beryllium, magnesium, strontium, barium, zinc, manganese, lithium, sodium, potassium, rubidium, praseodymium, samarium, and europium, and B represents a variable and is selected from the group consisting of boron, gallium, and scandium and wherein 0≤x≤1; 0<y≤0.2; 0.001≤a≤1 and 0.001≤b≤1.

2. The illumination system according to claim 1, wherein the radiation source is a light-emitting diode.

3. The illumination system according to claim 2, wherein the radiation source is selected from those light emitting diodes having an emission with a peak emission wavelength in the range of 400 to 480 nm.

4. The illumination system according to claim 2, wherein the radiation source is selected from those light emitting diodes having an emission with a peak emission wavelength in the range of 400 to 480 nm and the luminescent material comprises a cerium(III)-activated alkaline earth oxonitridoaluminosilicate of general formula $Ca_{1-x-y}A_xAl_{1+a-b}B_bSi_{1-a}N_{3-a}O_a:Ce_y$, wherein A represents a variable and is selected from the group consisting of beryllium, magnesium, strontium, barium, zinc, manganese, lithium, sodium, potassium, rubidium, praseodymium, samarium, europium, and B represents a variable and is selected from the group consisting of boron, gallium, scandium and wherein $0 \leq x \leq 1$; $0 < y \leq 0.2$; $0.001 \leq a \leq 1$ and $0.001 \leq b \leq 1$ and a second phosphor.

5. The illumination system according to claim 4, wherein said second phosphor is a red phosphor selected from the group consisting of $(Ca_{1-b}Sr_b)S:Eu$, wherein $0 \leq b \leq 1$ and $(Sr_{1-x-y}Ba_xCa_y)_{2-z}Si_{5-a}Al_aN_{8-a}O_a:Eu_z$ wherein $0 \leq a < 5.0$, $0 < x \leq 1$, $0 \leq y \leq 1$ and $0 < z \leq 1.0$.

6. The illumination system according to claim 4, wherein the second phosphor is a yellow to green phosphor selected from the group consisting of $(Ba_{1-x}Sr_x)_2SiO_4:Eu$, wherein $0 \leq x \leq 1$, $SrGa_2S_4:Eu$, $SrSi_2N_2O_2:Eu$, $Ln_3Al_5O_{12}:Ce$ and $YAG:Ce^{3+}$.

7. The illumination system according to claim 2, wherein the radiation source is selected from those light emitting diodes having an emission with a peak emission wavelength in the UV range of 200 to 400 nm and wherein the luminescent material comprises a cerium(III)-activated alkaline earth oxonitridoaluminosilicate of general formula $Ca_{1-x-y}A_xAl_{1+a-b}B_bSi_{1-a}N_{3-a}O_a:Ce_y$, wherein A represents a variable and is selected from the group consisting of beryllium, magnesium, strontium, barium, zinc, manganese, lithium, sodium, potassium, rubidium, praseodymium, samarium, and europium, and B represents a variable and is selected from the group consisting of boron, gallium, and scandium and wherein $0 \leq x \leq 1$; $0 < y \leq 0.2$; $0.001 \leq a \leq 1$ and $0.001 \leq b \leq 1$.

8. The illumination system according to claim 2, wherein the radiation source is selected from the light emitting diodes having an emission with a peak emission wavelength in the UV-range of 200 to 400 nm and wherein the luminescent material comprises a cerium(III)-activated alkaline earth oxonitridoaluminosilicate of general formula $Ca_{1-x-y}A_xAl_{1+a-b}B_bSi_{1-a}N_{3-a}O_a:Ce_y$, wherein A represents a variable and is selected from the group consisting of beryllium, magnesium, strontium, barium, zinc, manganese, lithium, sodium, potassium, rubidium, praseodymium, samarium, and europium, and B represents a variable and is selected from the group consisting of boron, gallium, and scandium and wherein $0 \leq x \leq 1$; $0 < y \leq 0.2$; $0.001 \leq a \leq 1$ and $0.001 \leq b \leq 1$ and a second phosphor.

9. The illumination system according to claim 8, wherein said second phosphor is a blue phosphor selected from the group consisting of $BaMgAl_{10}O_{17}:Eu$, $Ba_5SiO_4(Cl,Br)_6:Eu$, $CaLn_2S_4:Ce$, $(Sr,Ba,Ca)_5(PO_4)_3Cl:Eu$ and $LaSi_3N_5:Ce$.

10. The illumination system according to claim 8, wherein the second phosphor is a red phosphor selected from the group consisting of $(Ca_{1-x}Sr_x)S:Eu$, wherein $0 \leq x \leq 1$ and $(Sr_{1-w-y}Ba_wCa_y)_{2-z}Si_{5-a}Al_aN_{8-a}O_a:Eu_z$ wherein $0 \leq a < 5.0$, $0 < w \leq 1$, $0 < y \leq 1$ and $0 < z \leq 0.09$.

11. The illumination system according to claim 8, wherein the second phosphor is a yellow to green phosphor selected from the group consisting of $(Ba_{1-x}Sr_x)_2SiO_4:Eu$, wherein $0 \leq x \leq 1$, $SrGa_2S_4:Eu$, $SrSi_2N_2O_2:Eu$, $Ln_3Al_5O_{12}:Ce$ and $YAG:Ce^{3+}$.

12. A phosphor capable of absorbing part of light emitted by a radiation source and emitting light of wavelength different from that of the absorbed light; wherein said phosphor is a cerium(III)-activated alkaline earth oxonitridoaluminosilicate of general formula $Ca_{1-x-y}A_xAl_{1+a-b}B_bSi_{1-a}N_{3-a}O_a:Ce_y$, wherein A represents a variable and is selected from the group consisting of beryllium, magnesium, strontium, barium, zinc, manganese, lithium, sodium, potassium, rubidium, praseodymium, samarium, europium, and B represents a variable and is selected from the group consisting of boron, gallium, scandium and wherein $0 \leq x \leq 1$; $0 < y \leq 0.2$; $0.001 \leq a \leq 1$ and $0.001 \leq b \leq 1$.

13. The phosphor according to claim 12, wherein said phosphor is a cerium(III)-activated alkaline earth oxonitridoaluminosilicate of general formula $Ca_{0.98}Al_{1.01}B_{0.01}Si_{0.98}N_{2.98}O_{0.02}:Ce_{0.02}$.

* * * * *